US012471252B2

(12) United States Patent
Pu et al.

(10) Patent No.: US 12,471,252 B2
(45) Date of Patent: Nov. 11, 2025

(54) HEAT DISSIPATION DEVICE WITH COMMUNICATION FUNCTION

(71) Applicant: HTC Corporation, Taoyuan (TW)

(72) Inventors: Ta-Chun Pu, Taoyuan (TW);
Chun-Yih Wu, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 18/450,631

(22) Filed: Aug. 16, 2023

(65) Prior Publication Data
US 2023/0397371 A1 Dec. 7, 2023

Related U.S. Application Data

(63) Continuation of application No. 17/206,711, filed on Mar. 19, 2021, now Pat. No. 11,778,784.

(51) Int. Cl.
| | |
|---|---|
| *H05K 7/20* | (2006.01) |
| *H01Q 1/27* | (2006.01) |
| *H01Q 1/36* | (2006.01) |
| *H01Q 1/44* | (2006.01) |
| *H01Q 5/307* | (2015.01) |

(52) U.S. Cl.
CPC .......... *H05K 7/2039* (2013.01); *H01Q 1/273* (2013.01); *H01Q 1/36* (2013.01); *H01Q 1/44* (2013.01); *H01Q 5/307* (2015.01)

(58) Field of Classification Search
CPC ............ H01Q 1/36; H01Q 5/307; H01Q 1/44; H01Q 23/00; H01Q 1/02; H05K 7/20509; H05K 7/2039
See application file for complete search history.

(56) References Cited

U.S. PATENT DOCUMENTS

| | | |
|---|---|---|
| 4,833,766 A | 5/1989 | Herrell et al. |
| 5,212,625 A | 5/1993 | Van Andel et al. |
| 2002/0148603 A1 | 10/2002 | Kuo |

(Continued)

FOREIGN PATENT DOCUMENTS

| | | |
|---|---|---|
| CN | 204834822 U | 12/2015 |
| CN | 110676555 A | 1/2020 |

(Continued)

OTHER PUBLICATIONS

Covert et al., "Simulation and Measurement of a Heatsink Antenna: A Dual-Function Structure," IEEE Transactions on Antennas and Propagation, vol. 54, No. 4, 2006, pp. 1342-1345.

(Continued)

*Primary Examiner* — Adam B Dravininkas
(74) *Attorney, Agent, or Firm* — Birch, Stewart, Kolasch & Birch, LLP (57) ABSTRACT

A heat dissipation device with a communication function includes a conductive substrate, a first conductive sidewall, a plurality of heat sink elements, and a feeding element. The first conductive sidewall and the heat sink elements are respectively coupled to the conductive substrate. The feeding element is coupled to a signal source. An antenna structure is formed by the feeding element, the conductive substrate, and at least one of the heat sink elements. A resonant path of the antenna structure is formed by at least one of the heat sink elements.

32 Claims, 12 Drawing Sheets

(56) References Cited

U.S. PATENT DOCUMENTS

| | | | |
|---|---|---|---|
| 2006/0071859 A1* | 4/2006 | Condon | H01Q 1/2258 343/700 MS |
| 2007/0119583 A1 | 5/2007 | Foster, Sr. et al. | |
| 2007/0177355 A1 | 8/2007 | Ito et al. | |
| 2009/0045191 A1* | 2/2009 | Ben-Shmuel | H05B 6/666 219/746 |
| 2009/0279265 A1* | 11/2009 | Imazato | H01L 23/367 361/710 |
| 2010/0188205 A1 | 7/2010 | Dilbeck | |
| 2010/0207834 A1* | 8/2010 | Wahlberg | H01Q 21/064 343/762 |
| 2011/0260944 A1* | 10/2011 | Ferris | H01Q 1/02 343/872 |
| 2012/0320523 A1 | 12/2012 | Murakami et al. | |
| 2013/0032323 A1 | 2/2013 | Hsu | |
| 2013/0222201 A1* | 8/2013 | Ma | H01Q 1/246 343/834 |
| 2015/0048978 A1* | 2/2015 | Derovanessian | H05K 7/20 343/702 |
| 2017/0214150 A1* | 7/2017 | Zhao | H01L 23/36 |
| 2018/0077817 A1 | 3/2018 | Tang-Kong | |
| 2018/0142965 A1 | 5/2018 | Onda et al. | |
| 2018/0219277 A1* | 8/2018 | Hirata | H01Q 1/02 |
| 2020/0021040 A1 | 1/2020 | Yong et al. | |
| 2020/0022291 A1* | 1/2020 | Matsuzaki | H05K 9/0083 |
| 2020/0028237 A1 | 1/2020 | Kim et al. | |
| 2020/0185299 A1 | 6/2020 | Chang et al. | |
| 2020/0395678 A1 | 12/2020 | Shamblin et al. | |
| 2021/0408658 A1* | 12/2021 | Pais | H01Q 9/0421 |

FOREIGN PATENT DOCUMENTS

| | | |
|---|---|---|
| CN | 111092284 A | 5/2020 |
| CN | 111525227 A | 8/2020 |
| CN | 112259947 A | 1/2021 |
| KR | 10-2020-0132659 A | 11/2020 |
| TW | 412915 B | 11/2000 |
| TW | 200807804 A | 2/2008 |

OTHER PUBLICATIONS

Dogan et al., "Variation of Radiated Emission from Heatsinks on PCB according to Fin Types," 2019 3rd International Symposium on Multidiciplinary Studies and Innovative Technologies (ISMSIT), 2019, 4 pages total.

Kosaka et al., "Heat Dissipation Antenna Array for Compact Massive MIMO Radio Unit," 2018 IEEE International Symposium on Antennas and Propagation & USNC/URSI National Radio Science Meeting, 2019, 2 pages total.

O'Shea, "Heat Sink Antenna for Small Wireless Electronic Devices", Electronics Today, published on May 5, 2012, with English translation.

* cited by examiner

HEAT DISSIPATION DEVICE WITH COMMUNICATION FUNCTION

CROSS REFERENCE TO RELATED APPLICATIONS

This application is a Continuation Application of U.S. patent application Ser. No. 17/206,711, filed on Mar. 19, 2021, the entirety of which is incorporated by reference herein.

BACKGROUND OF THE INVENTION

Field of the Invention

The disclosure generally is related to a heat dissipation device, and more particularly, it is related to a heat dissipation device with a communication function.

Description of the Related Art

With the advancements being made in mobile communication technology, mobile devices such as portable computers, mobile phones, multimedia players, and other hybrid functional portable electronic devices have become more common. To satisfy user demand, mobile devices can usually perform wireless communication functions. Some devices cover a large wireless communication area; these include mobile phones using 2G, 3G, and LTE (Long Term Evolution) systems and using frequency bands of 700 MHz, 850 MHz, 900 MHz, 1800 MHz, 1900 MHz, 2100 MHz, 2300 MHz, 2500 MHz, and 2700 MHz. Some devices cover a small wireless communication area; these include mobile phones using Wi-Fi and Bluetooth systems and using frequency bands of 2.4 GHz, 5.2 GHz, and 5.8 GHz.

Antennas are indispensable elements of mobile devices supporting wireless communication. However, since mobile devices and HMDs (Head Mounted Display) of VR, AR, MR, etc., have limited inner space, they cannot accommodate antenna elements with large sizes. Accordingly, there is a need to propose a novel solution for solving the problems of the prior art.

BRIEF SUMMARY OF THE INVENTION

In an exemplary embodiment, the disclosure is directed to a heat dissipation device with a communication function. The heat dissipation device includes a conductive substrate, a first conductive sidewall, a plurality of heat sink elements, and a feeding element. The first conductive sidewall and the heat sink elements are respectively coupled to the conductive substrate. The feeding element is coupled to a signal source. An antenna structure is formed by the feeding element, the conductive substrate, and at least one of the heat sink elements. A resonant path of the antenna structure is formed by the at least one of the heat sink elements.

In some embodiments, the heat dissipation device further includes a second conductive sidewall. The heat sink elements are positioned between the first conductive sidewall and the second conductive sidewall. The first conductive sidewall, the heat sink elements, and the second conductive sidewall are substantially perpendicular to the conductive substrate.

In some embodiments, the first conductive sidewall and the heat sink elements are substantially parallel with each other.

In some embodiments, the heat sink elements have different lengths. The first conductive sidewall and the heat sink elements define a plurality of open slots with different lengths.

In some embodiments, each of the open slots has an open end and a closed end.

In some embodiments, the open slots are excited to generate a plurality of resonant modes with different frequencies, so that the antenna structure is capable of covering wideband operations.

In some embodiments, the feeding element directly touches one or more of the heat sink elements.

In some embodiments, the feeding element is adjacent to but does not directly touch one or more of the heat sink elements.

In some embodiments, the heat dissipation device further includes a conductive ramp element disposed on the conductive substrate. The conductive ramp element is configured to support the heat sink elements, so that the first conductive sidewall and the heat sink elements define a plurality of open slots with different lengths. The open slots are excited to generate a plurality of resonant modes with different frequencies, so that the antenna structure is capable of covering wideband operations.

In some embodiments, each of the heat sink elements substantially has a U-shape.

In some embodiments, each of the heat sink elements has a notch.

In some embodiments, the heat sink elements have the same lengths. The first conductive sidewall and the heat sink elements define a plurality of open slots with the same lengths. The open slots are excited to generate a resonant mode with the same frequency.

In some embodiments, each of the heat sink elements has a notch. The notches have different lengths. The notches are substantially arranged in the same straight line.

In some embodiments, the heat dissipation device is applicable to an HMD (Head Mount Display) supporting VR (Virtual Reality), AR (Augmented Reality) or MR (Mixed Reality).

In some embodiments, each of the heat sink elements has a notch. The notches have different lengths. The notches are substantially arranged in different straight lines.

In some embodiments, two resonant paths of the antenna structure are formed by at least two of the heat sink elements. The antenna structure covers a first frequency band and a second frequency band.

In some embodiments, the lengths of the heat sink elements are shorter than or equal to the lengths of the first conductive sidewall and the second conductive sidewall.

In some embodiments, terminals of the heat sink elements, a first terminal of the first conductive sidewall, and a second terminal of the second conductive sidewall are aligned with each other and are positioned on the same plane.

In some embodiments, a coupling channel is formed by the notches.

In some embodiments, each of the heat sink elements substantially has a U-shape with a notch. The notches are configured to increase the effective resonant lengths of the heat sink elements.

In some embodiments, the antenna structure has a low-frequency resonant path, a high-frequency resonant path, and a coupling resonant path. The low-frequency resonant path mainly consists of relatively long heat sink elements. The high-frequency resonant path mainly consists of relatively short heat sink elements.

In some embodiments, each of the heat sink elements has a notch. The notches have the same lengths. The notches are substantially arranged in the same straight line. A coupling channel is formed by the notches.

In some embodiments, each of the heat sink elements has a notch. The notches have different lengths. The notches are substantially arranged in different straight lines. The coupling channel is formed by the notches.

In some embodiments, the antenna structure has a resonant path and a coupling resonant path.

In some embodiments, the heat dissipation device further includes a conductive ramp element disposed on the conductive substrate. The conductive ramp element is configured to support the heat sink elements. The heat sink elements have the same lengths. The first conductive sidewall and the heat sink elements define a plurality of open slots with different lengths. The open slots are excited to generate a plurality of resonant modes with different frequencies.

In some embodiments, the heat dissipation device further includes a conductive ramp element disposed on the conductive substrate. The conductive ramp element is configured to support the heat sink elements. The heat sink elements have different lengths. The first conductive sidewall and the heat sink elements define a plurality of open slots with different lengths. The open slots are excited to generate a plurality of resonant modes with different frequencies. The conductive ramp element makes terminals of the heat sink elements aligned with each other.

In some embodiments, each of the heat sink elements has a notch. The notches have the same lengths. The notches are substantially arranged in the same straight line. A coupling channel is formed by the notches.

In some embodiments, each of the heat sink elements has a notch. The notches have different length. The notches are substantially arranged in different straight lines. A coupling channel is formed by the notches.

In some embodiments, the antenna structure has a low-frequency resonant path and a high-frequency resonant path. The low-frequency resonant path mainly consists of relatively long heat sink elements. The high-frequency resonant path mainly consists of relatively short heat sink elements.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are shown in detail below.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
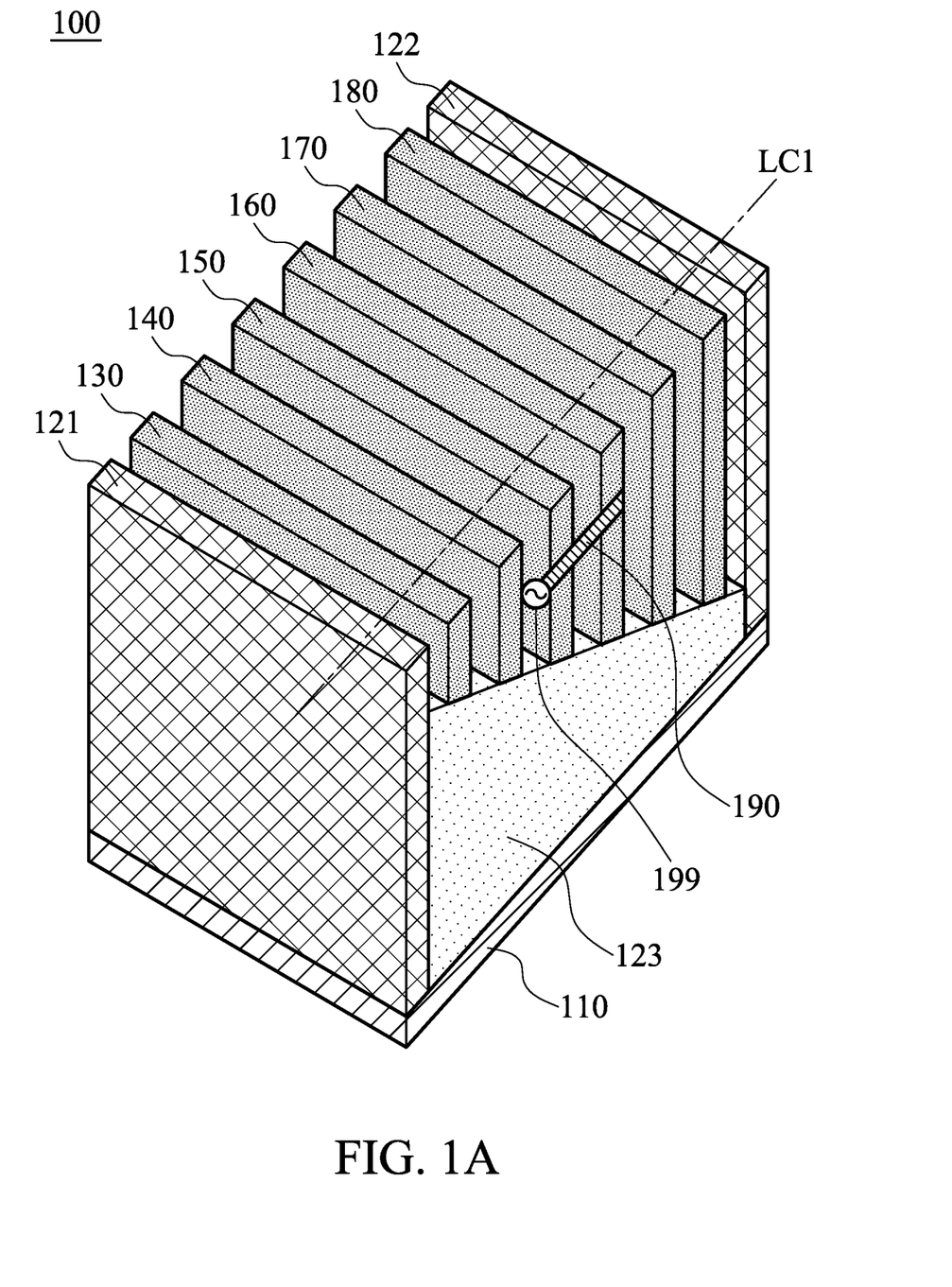
FIG. 1A is a perspective view of a heat dissipation device according to an embodiment of the invention.
Figure 1B:
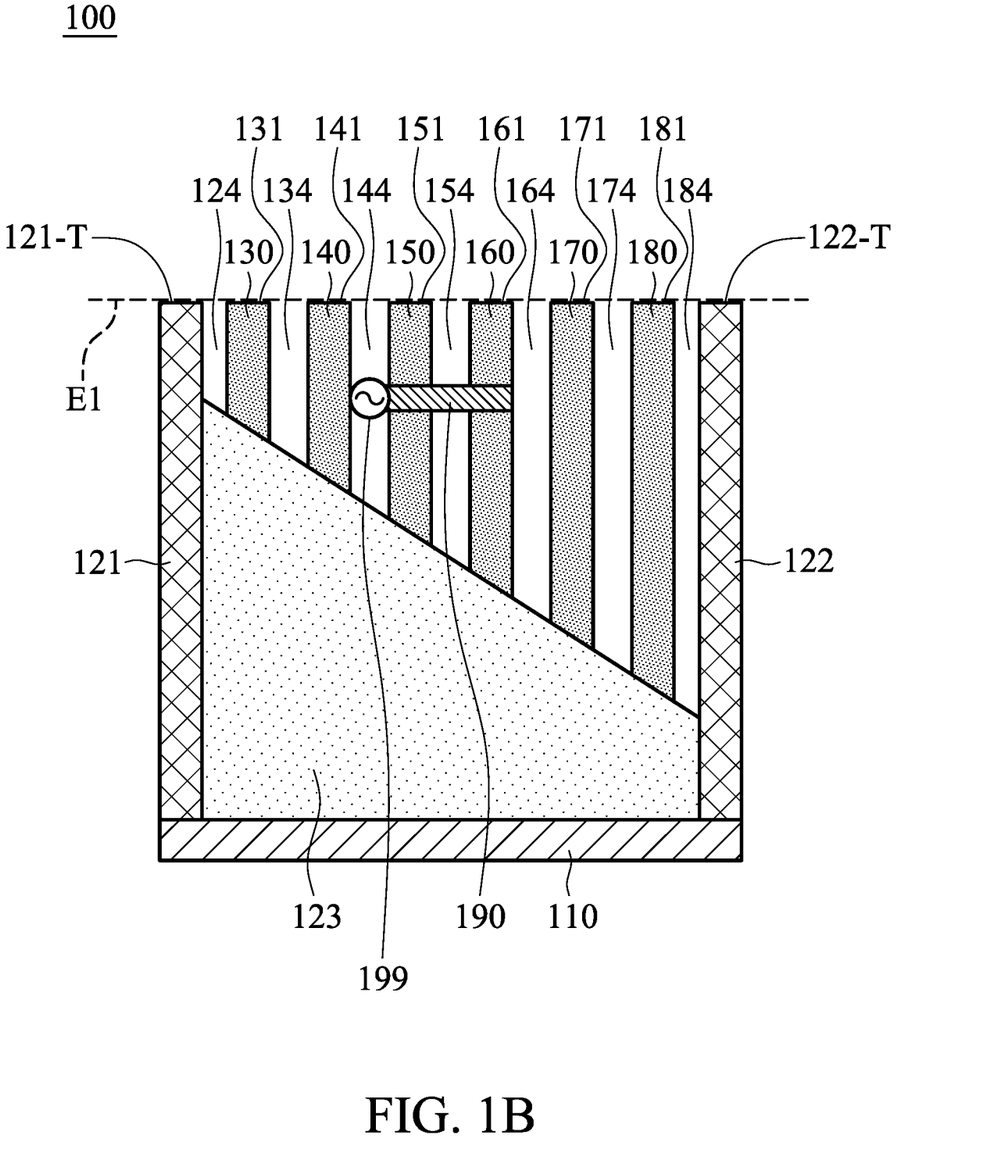
FIG. 1B is a sectional view of a heat dissipation device according to an embodiment of the invention.

FIG. 1A is a perspective view of a heat dissipation device 100 according to an embodiment of the invention. FIG. 1B is a sectional view of the heat dissipation device 100 according to an embodiment of the invention (along a sectional line LC1). Please refer to FIG. 1A and FIG. 1B together. The heat dissipation device 100 may be applied to a mobile device, such as an HMD (Head Mounted Display), a smartphone, a tablet computer, or a notebook computer. In the embodiment of FIG. 1A and FIG. 1B, the heat dissipation device 100 at least includes a conductive substrate 110, a first conductive sidewall 121, a second conductive sidewall 122, a plurality of heat sink elements 130, 140, 150, 160, 170 and 180, and a feeding element 190. All of the above elements may be made of metal materials. It should be understood that the heat dissipation device 100 may further include other components, such as a connection element and/or a housing, although they are not displayed in FIG. 1A and FIG. 1B.

The number of heat sink elements 130, 140, 150, 160, 170 and 180 is not limited in the invention. In other embodiments, the heat dissipation device 100 may include more or fewer heat sink elements. The heat sink elements 130, 140, 150, 160, 170 and 180 have different lengths, and they are all positioned between the first conductive sidewall 121 and the second conductive sidewall 122. In some embodiments, the length of each of the heat sink elements 130, 140, 150, 160, 170 and 180 is shorter than or equal to the length of each of the first conductive sidewall 121 and the second conductive sidewall 122. The first conductive sidewall 121, the heat sink elements 130, 140, 150, 160, 170 and 180, and the second conductive sidewall 122 are respectively coupled to the conductive substrate 110. An antenna structure is formed by the feeding element 190, the conductive substrate 110, and the heat sink elements 130, 140, 150, 160, 170 and 180. In some embodiments, the aforementioned antenna structure further includes at least one of the first conductive sidewall 121 and the second conductive sidewall 122. That is, the heat dissipation device 100 can not only remove excess heat but also provide the function of wireless communication.

The first conductive sidewall 121, the heat sink elements 130, 140, 150, 160, 170 and 180, and the second conductive sidewall 122 may all be substantially perpendicular to the conductive substrate 110. Furthermore, the first conductive sidewall 121, the heat sink elements 130, 140, 150, 160, 170 and 180, and the second conductive sidewall 122 may be substantially parallel to each other. For example, any two adjacent elements from among the first conductive sidewall 121, the heat sink elements 130, 140, 150, 160, 170 and 180, and the second conductive sidewall 122 may substantially be the same distance apart, but they are not limited thereto.

The feeding element 190 is coupled to a signal source 199. For example, the signal source 199 may be an RF (Radio Frequency) module. The aforementioned antenna structure can be directly excited by the feeding element 190, or can be excited by the feeding element 190 using a coupling mechanism. In some embodiments, the feeding element 190 is integrated with the signal source 199, and they are implemented with a coaxial cable, a microstrip line, or an FPC (Flexible Printed Circuit Board).

In some embodiments, the heat dissipation device 100 further includes a conductive ramp element 123. The conductive ramp element 123 is disposed on the conductive substrate 110, and is configured to support and fix the heat sink elements 130, 140, 150, 160, 170 and 180 in such a way that terminals 131, 141, 151, 161, 171 and 181 of the heat sink elements 130, 140, 150, 160, 170 and 180 can be aligned with each other. For example, the terminals 131, 141, 151, 161, 171 and 181 of the heat sink elements 130, 140, 150, 160, 170 and 180 may be positioned on the same plane E1. In addition, the terminals 131, 141, 151, 161, 171 and 181, a first terminal 121-T of the first conductive sidewall 121, and a second terminal 122-T of the second conductive sidewall 122 may be aligned with each other, and they are all positioned on the same plane E1. Furthermore, the heat sink elements 130, 140, 150, 160, 170 and 180 may be further coupled through the conductive ramp element 123 to the conductive substrate 110. It should be understood that the conductive ramp element 123 is an optional component. In alternative embodiments, the conductive ramp element 123 is removable, so that the heat sink elements 130, 140, 150, 160, 170 and 180 may be coupled directly to the conductive substrate 110, respectively.

Since the heat sink elements 130, 140, 150, 160, 170 and 180 have different lengths, the first conductive sidewall 121, the heat sink elements 130, 140, 150, 160, 170 and 180, and the second conductive sidewall 122 can define a plurality of open slots 124, 123, 144, 154, 164, 174 and 184 with different lengths. For example, each of the open slots 124, 123, 144, 154, 164, 174 and 184 may have an open end and a closed end.

With respect to the antenna theory, since the open slots 124, 123, 144, 154, 164, 174 and 184 are excited to generate a plurality of resonant modes with different frequencies, the antenna structure of the heat dissipation device 100 is capable of covering a relatively large operation bandwidth. Specifically, the open slots 124 and 134 with short lengths correspond to relatively high-frequency bands, the open slots 144, 154 and 164 with median lengths correspond to relatively median-frequency bands, and the open slots 174 and 184 with long lengths correspond to relatively low-frequency bands.

In some embodiments, the antenna structure can cover a first frequency band and a second frequency band. The first frequency band may be from 2400 MHz to 2500 MHz. The second frequency band may be from 3100 MHz to 7125 MHz. Therefore, the antenna structure of the heat dissipation device 100 can support the wideband operations of conventional WLAN (Wireless Local Area Networks) and the next-generation 5G communication. With the design of the invention, the antenna structure for wireless communication is integrated with the heat dissipation device 100, and therefore the whole device size can be effectively reduced.

Figure 2A:
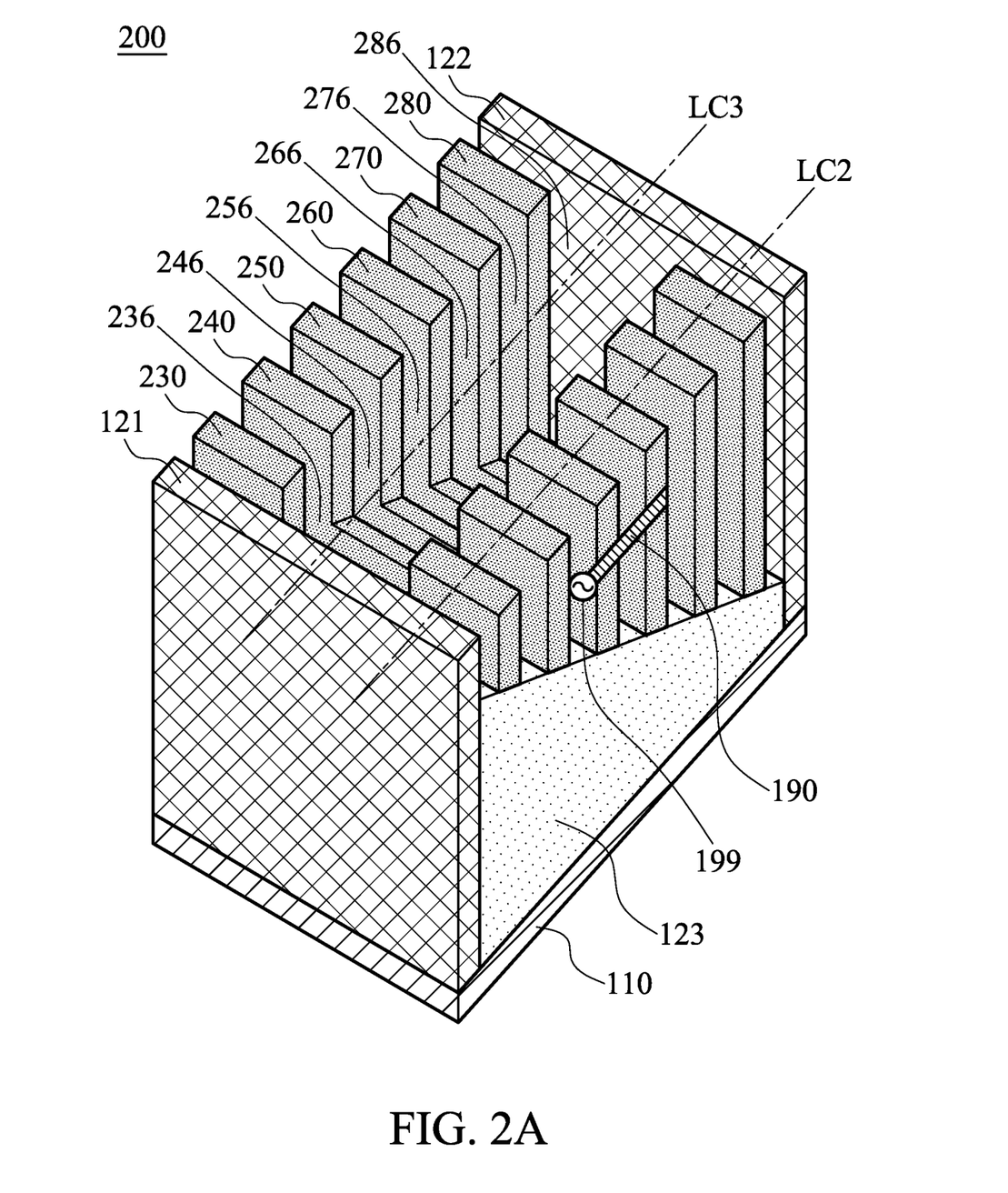
FIG. 2A is a perspective view of a heat dissipation device according to an embodiment of the invention.
Figure 2B:
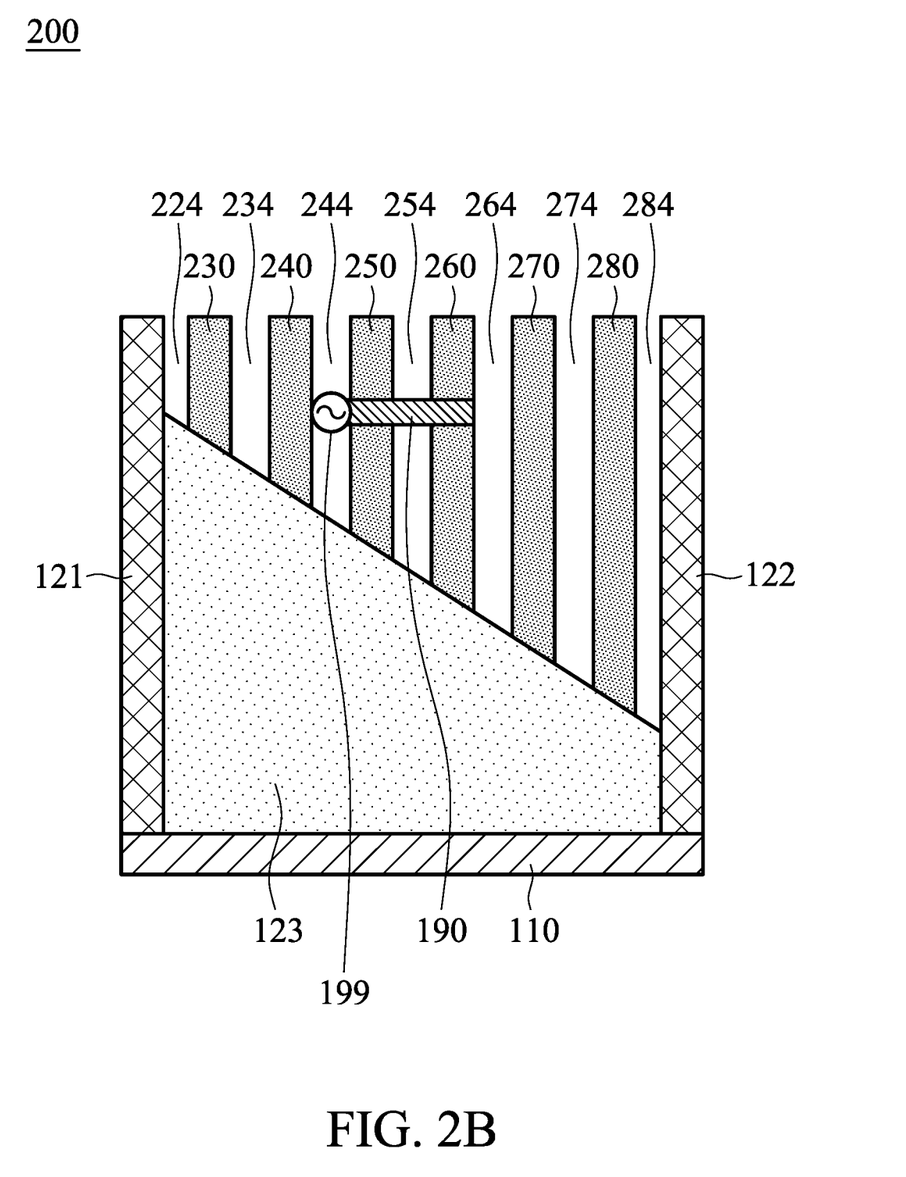
FIG. 2B is a sectional view of a heat dissipation device according to an embodiment of the invention.
Figure 2C:
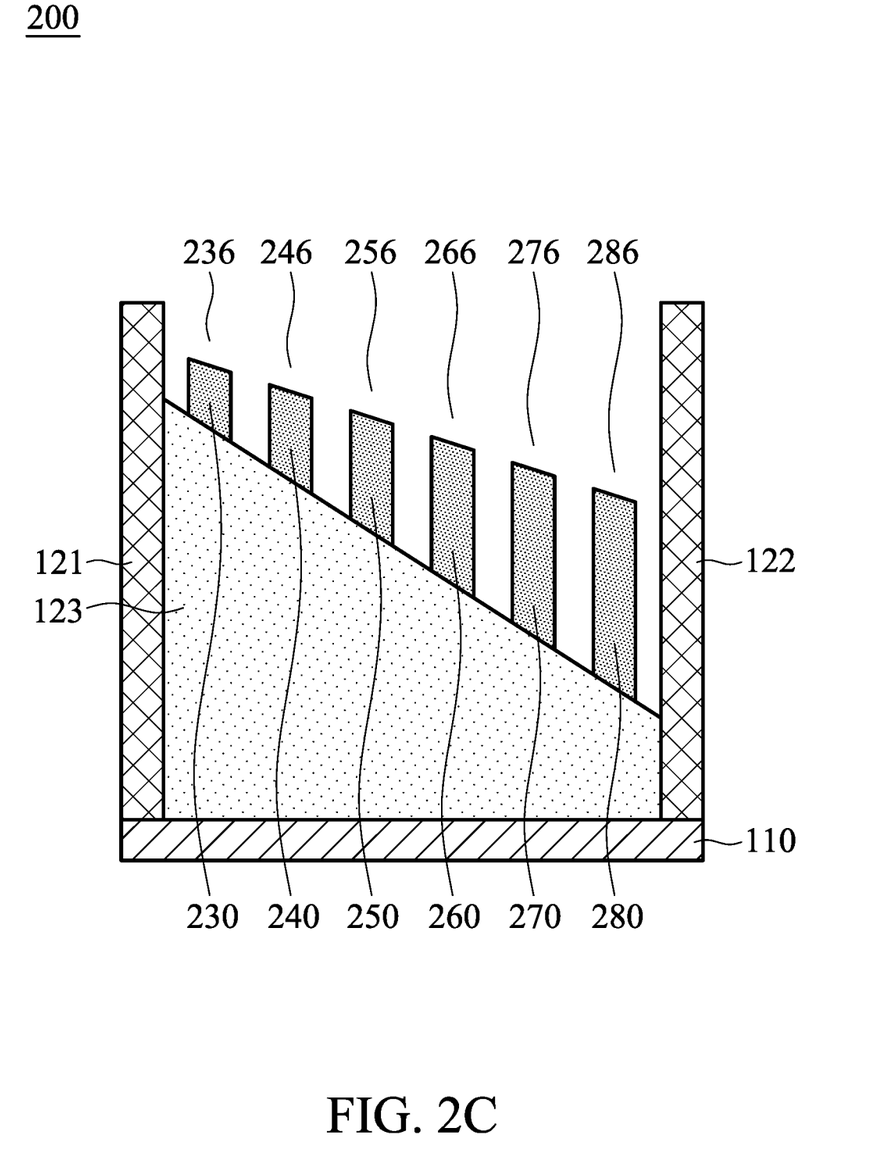
FIG. 2C is a sectional view of a heat dissipation device according to an embodiment of the invention.

FIG. 2A is a perspective view of a heat dissipation device 200 according to an embodiment of the invention. FIG. 2B is a sectional view of the heat dissipation device 200 according to an embodiment of the invention (along a sectional line LC2). FIG. 2C is a sectional view of the heat dissipation device 200 according to an embodiment of the invention (along another sectional line LC3). Please refer to FIG. 2A, FIG. 2B and FIG. 2C together. FIG. 2A, FIG. 2B and FIG. 2C are similar to FIG. 1A and FIG. 1B. In the embodiment of FIG. 2A, FIG. 2B and FIG. 2C, a plurality of heat sink elements 230, 240, 250, 260, 270 and 280 of the heat dissipation device 200 have a plurality of notches 236, 246, 256, 266, 276 and 286, respectively. For example, each of the heat sink elements 230, 240, 250, 260, 270 and 280 may substantially have a U-shape, and each of the notches 236, 246, 256, 266, 276 and 286 may substantially have a rectangular shape. The notches 236, 246, 256, 266, 276 and 286 may have different lengths. Specifically, the notches 236 and 246 may have relatively short lengths, the notches 256 and 266 may have median lengths, and the notches 276 and 286 may have relatively long lengths. In addition, the notches 236, 246, 256, 266, 276 and 286 may be aligned with each other, and they may all be substantially arranged in the same straight line (e.g., along the direction of the sectional line LC3). However, the invention is not limited thereto. In alternative embodiments, each of the notches 236, 246, 256, 266, 276 and 286 substantially has a semicircular shape, a triangular shape, or a square shape.

Similarly, the heat sink elements 230, 240, 250, 260, 270 and 280 have different lengths, and they are all positioned between the first conductive sidewall 121 and the second conductive sidewall 122. The first conductive sidewall 121, the heat sink elements 230, 240, 250, 260, 270 and 280, and the second conductive sidewall 122 are respectively coupled to the conductive substrate 110 (e.g., through the conductive ramp element 123). An antenna structure is formed by the feeding element 190, the conductive substrate 110, and the heat sink elements 230, 240, 250, 260, 270 and 280. In some embodiments, the aforementioned antenna structure further includes at least one of the first conductive sidewall 121, the second conductive sidewall 122, and the conductive ramp element 123. Since the heat sink elements 230, 240, 250, 260, 270 and 280 have different lengths, the first conductive sidewall 121, the heat sink elements 230, 240, 250, 260, 270 and 280, and the second conductive sidewall 122 can define a plurality of open slots 224, 223, 244, 254, 264, 274 and 284 with different lengths. Each of the open slots 224, 223, 244, 254, 264, 274 and 284 may have an open end and a closed end.

Figure 3A:
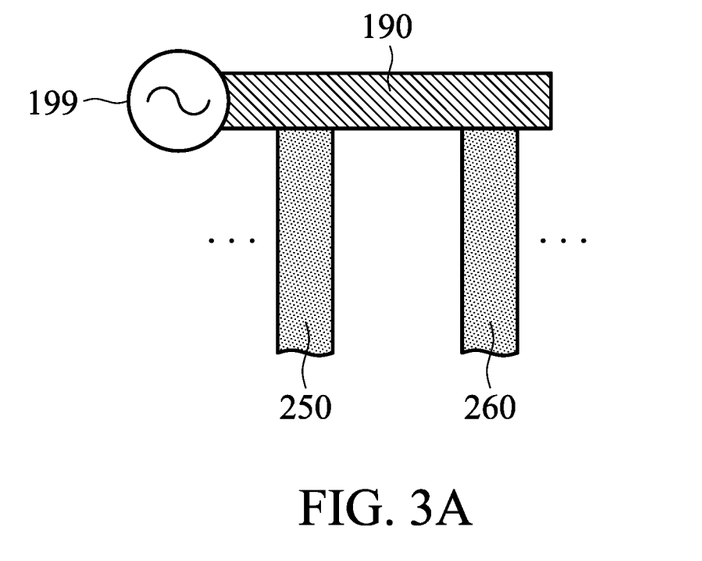
FIG. 3A is a diagram of a direct excitation mechanism of an antenna structure according to an embodiment of the invention.
Figure 3B:
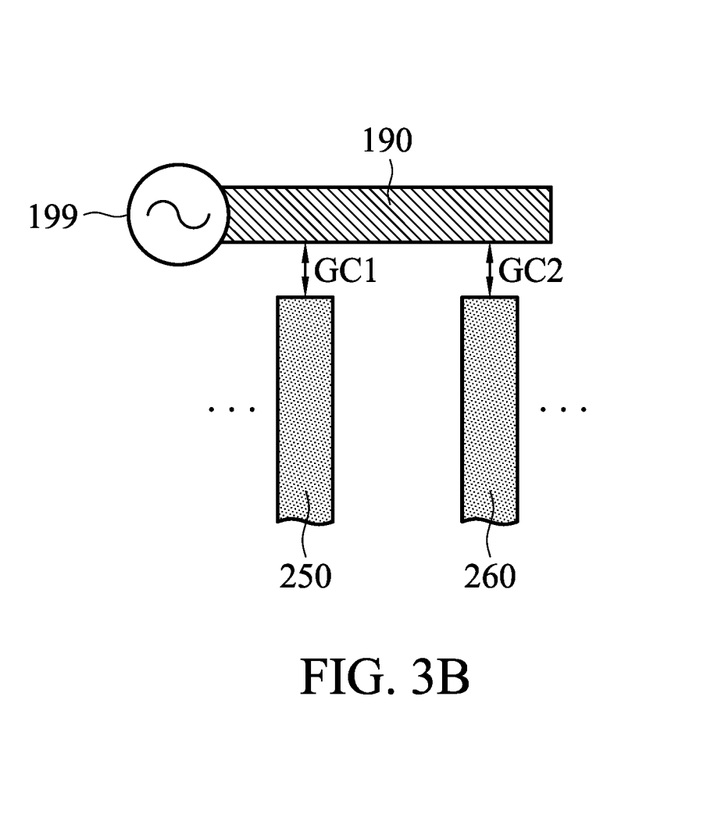
FIG. 3B is a diagram of a coupling excitation mechanism of an antenna structure according to an embodiment of the invention.

The antenna structure of the heat dissipation device 200 can be directly excited or excited using a coupling mechanism by the feeding element 190 and the signal source 199. FIG. 3A is a diagram of a direct excitation mechanism of the antenna structure according to an embodiment of the invention. In the embodiment of FIG. 3A, the feeding element 190 directly touches one or more of the heat sink elements 230, 240, 250, 260, 270 and 280 (e.g., the heat sink elements 250 and 260 at the middle position). FIG. 3B is a diagram of a coupling excitation mechanism of the antenna structure according to an embodiment of the invention. In the embodiment of FIG. 3B, the feeding element 190 is adjacent to but does not directly touch one or more of the heat sink elements 230, 240, 250, 260, 270 and 280 (e.g., the heat sink elements 250 and 260 at the middle position). It should be noted that the term "adjacent" or "close" over the disclosure means that the distance (spacing) between two corresponding elements is shorter than a predetermined distance (e.g., 5 mm or shorter), but often it does not mean that the two corresponding elements are touching each other directly (i.e., the aforementioned distance/spacing therebetween is reduced to 0). For example, a first coupling gap GC1 may be formed between the feeding element 190 and the heat sink element 250, and a second coupling gap GC2 may be formed between the feeding element 190 and the heat sink element 260, but they are not limited thereto. The direct excitation mechanism and the coupling excitation mechanism as described above do not affect the radiation performance of the antenna structure.

It should be noted that the notches 236, 246, 256, 266, 276 and 286 arranged in the same straight line are considered as a coupling channel, which helps to improve the transmission of electromagnetic energy and increase the operation bandwidth of the antenna structure. Furthermore, the incorporation of the notches 236, 246, 256, 266, 276 and 286 can also increase the effective resonant lengths of the heat sink elements 230, 240, 250, 260, 270 and 280, thereby further reducing the size of the antenna structure.

Figure 2D:
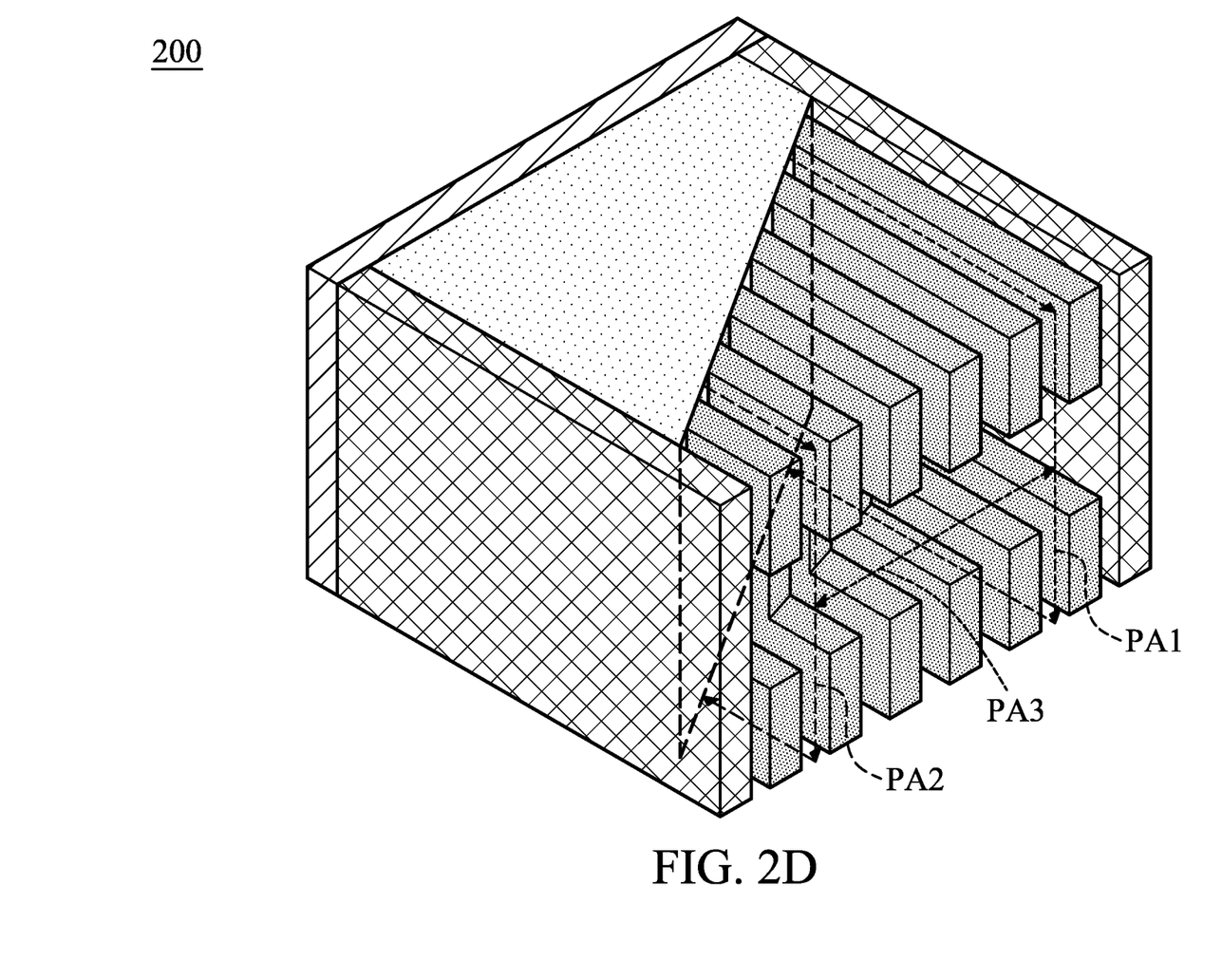
FIG. 2D is a diagram of resonant paths of an antenna structure of a heat dissipation device according to an embodiment of the invention.

FIG. 2D is a diagram of resonant paths of the antenna structure of the heat dissipation device 200 according to an embodiment of the invention. As shown in FIG. 2D, the antenna structure of the heat dissipation device 200 has a low-frequency resonant path PA1, a high-frequency resonant path PA2, and a coupling resonant path PA3. The low-frequency resonant path PA1 mainly consists of relatively long heat sink elements, and it corresponds to the aforementioned first frequency band. The high-frequency resonant path PA2 mainly consists of relatively short heat sink elements, and it corresponds to the aforementioned second frequency band. The coupling resonant path PA3 is configured to fine-tune the impedance of both the first frequency band and the second frequency band as described above, so as to optimize the antenna radiation performance.

Figure 4A:
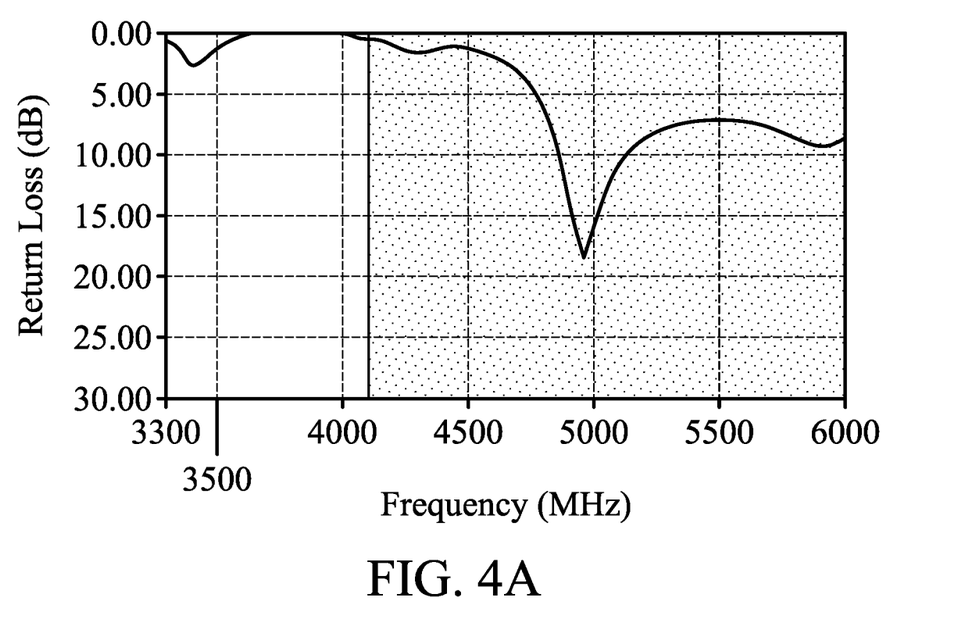
FIG. 4A is a diagram of return loss of an antenna structure of a heat dissipation device according to an embodiment of the invention.
Figure 4B:
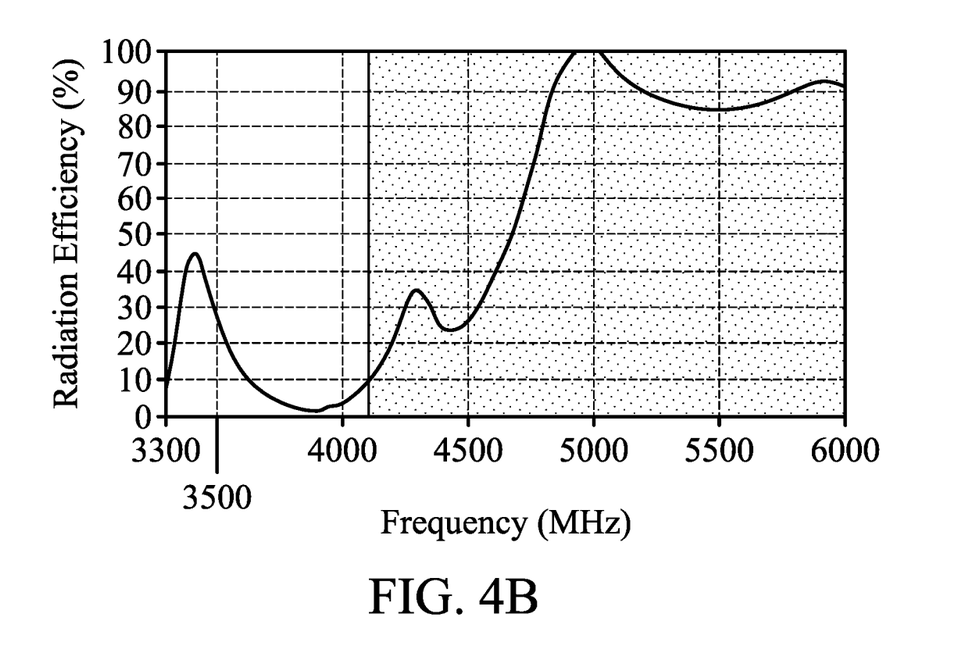
FIG. 4B is a diagram of radiation efficiency of an antenna structure of a heat dissipation device according to an embodiment of the invention.

FIG. 4A is a diagram of return loss of the antenna structure of the heat dissipation device 200 according to an embodiment of the invention. The horizontal axis represents the operation frequency (MHz), and the vertical axis represents the return loss (dB). FIG. 4B is a diagram of radiation efficiency of the antenna structure of the heat dissipation device 200 according to an embodiment of the invention. The horizontal axis represents the operation frequency (MHz), and the vertical axis represents the radiation efficiency (%). According to the measurement of FIG. 4A and FIG. 4B, the antenna structure of the heat dissipation device 200 can support at least the wideband operations of the next-generation 5G communication. Other features of the heat dissipation device 200 of FIG. 2A, FIG. 2B and FIG. 2C are similar to those of the heat dissipation device 100 of FIG. 1A and FIG. 1B. Accordingly, the two embodiments can achieve similar levels of performance.

Figure 5A:
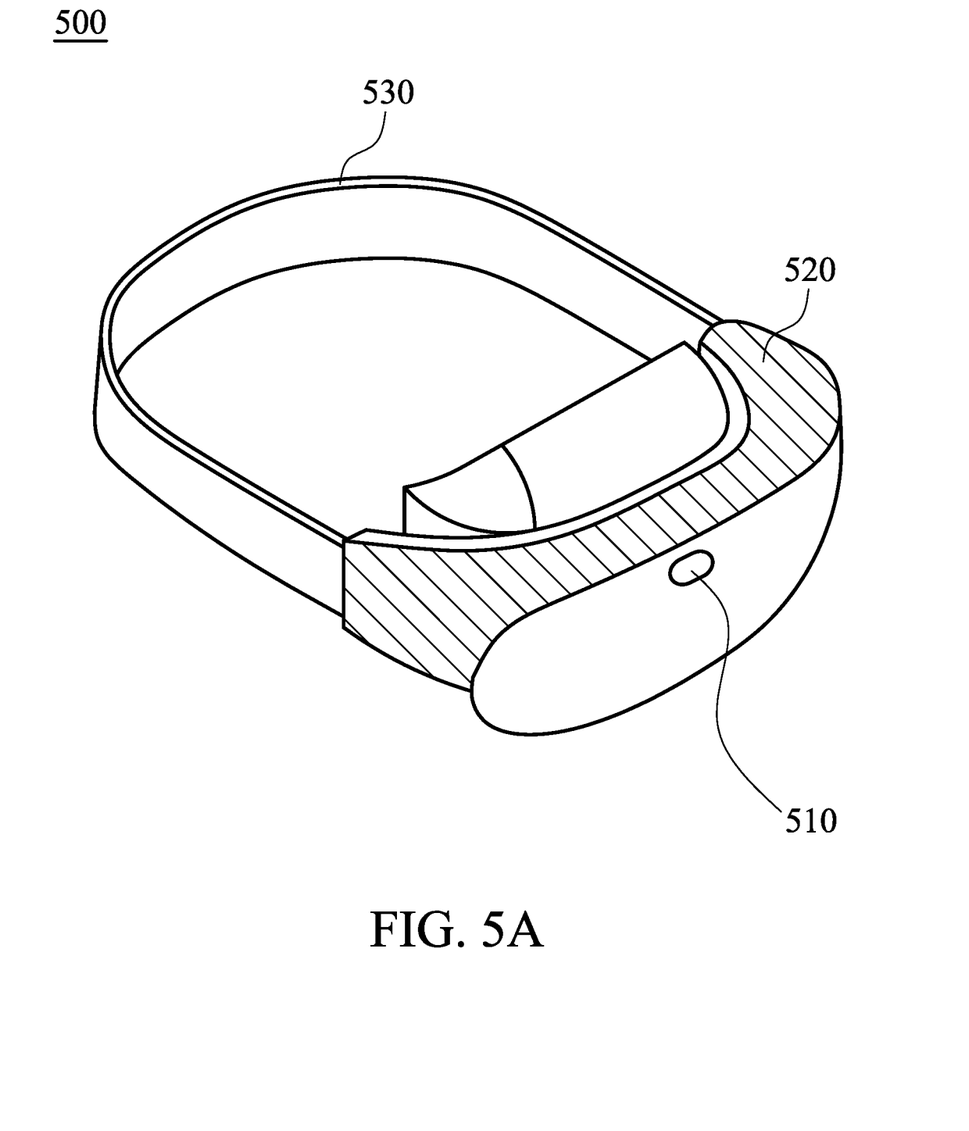
FIG. 5A is a perspective view of an HMD (Head Mounted Display) according to an embodiment of the invention.
Figure 5B:
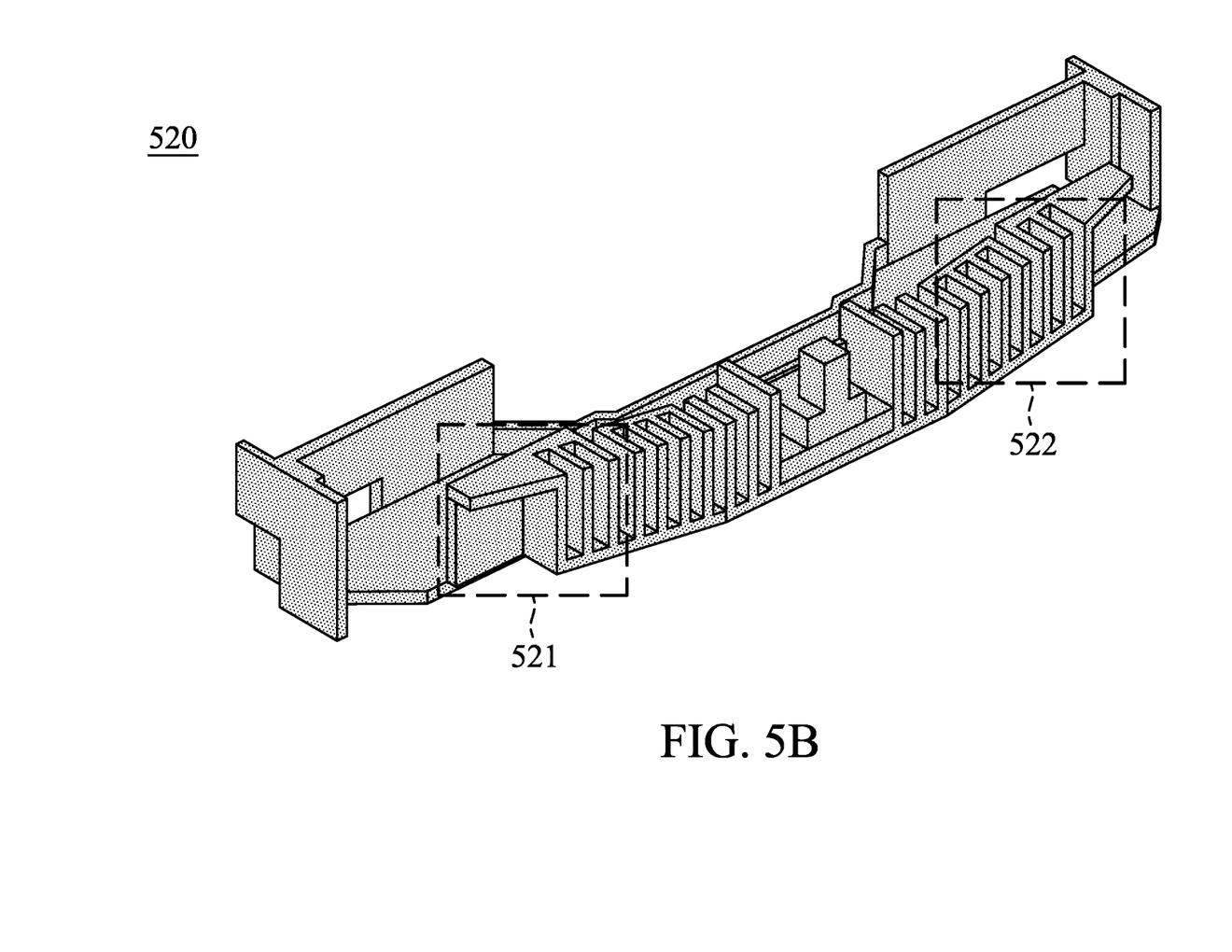
FIG. 5B is a perspective view of a heat dissipation portion of an HMD according to an embodiment of the invention.

FIG. 5A is a perspective view of an HMD (Head Mounted Display) 500 according to an embodiment of the invention. In the embodiment of FIG. 5A, the aforementioned heat dissipation device 100 (or 200) is applicable to the HMD 500 supporting VR (Virtual Reality), AR (Augmented Reality) or MR (Mixed Reality). The HMD 500 includes a display portion 510, a heat dissipation portion 520, and a headband portion 530. FIG. 5B is a perspective view of the heat dissipation portion 520 of the HMD 500 according to an embodiment of the invention. For example, the aforementioned heat dissipation device 100 (or 200) may be designed at a first position 521 or a second position 522 on the heat dissipation portion 520 of the HMD 500, but it is not limited thereto. Because the heat dissipation portion 520 is an essential component of the HMD 500, such a design of the invention has the advantages of both small size and wide bandwidth by appropriately integrating the antenna structure with the heat dissipation portion 520.

Figure 6:
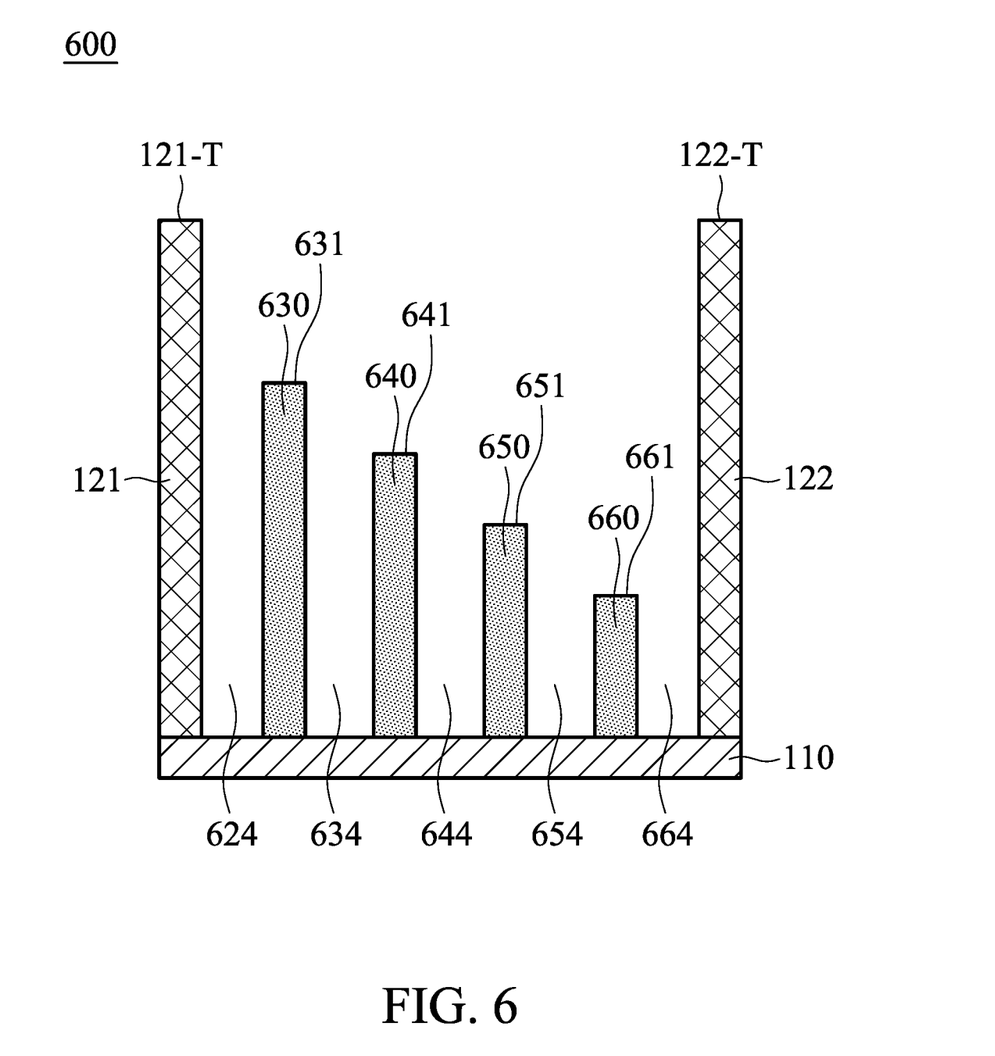
FIG. 6 is a sectional view of a heat dissipation device according to an embodiment of the invention.

FIG. 6 is a sectional view of a heat dissipation device 600 according to an embodiment of the invention. The embodiment of FIG. 6 is similar to FIG. 1B, but it does not use any conductive ramp element. Thus, a plurality of heat sink elements 630, 640, 650 and 660 of the heat dissipation device 600 are directly coupled to the conductive substrate 110, respectively. Since the heat sink elements 630, 640, 650 and 660 have different lengths, the first conductive sidewall 121, the heat sink elements 630, 640, 650 and 660, and the second conductive sidewall 122 can define a plurality of open slots 624, 634, 644, 654 and 664 with different lengths. In some embodiments, the length of each of the heat sink elements 630, 640, 650 and 660 is shorter than the length of each of the first conductive sidewall 121 and the second conductive sidewall 122. Each of the open slots 624, 634, 644, 654 and 664 has an open end and a closed end. According to practical measurements, the antenna structure of the heat dissipation device 600 can cover wideband operations although terminals 631, 641, 651 and 661 of the heat sink elements 630, 640, 650 and 660 are not aligned with each other on the same plane. Furthermore, the terminals 631, 641, 651 and 661 are neither aligned with the first terminal 121-T of the first conductive sidewall 121 nor aligned with the second terminal 122-T of the second conductive sidewall 122. Other features of the heat dissipation device 600 of FIG. 6 are similar to those of the heat dissipation device 100 of FIG. 1A and FIG. 1B. Accordingly, the two embodiments can achieve similar levels of performance.

Figure 7:
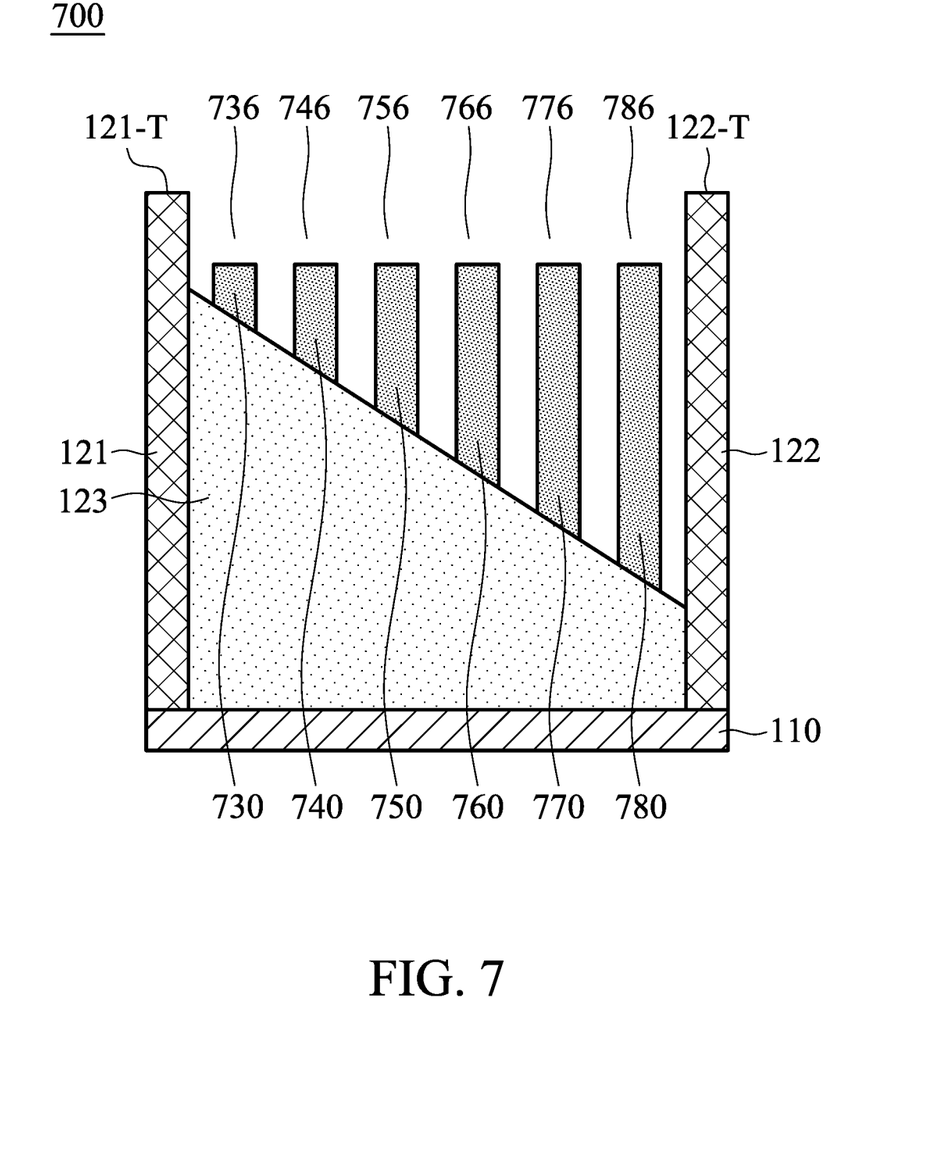
FIG. 7 is a sectional view of a heat dissipation device according to an embodiment of the invention.

FIG. 7 is a sectional view of a heat dissipation device 700 according to an embodiment of the invention. The embodiment of FIG. 7 is similar to FIG. 2C. However, in the heat dissipation device 700 of FIG. 7, a plurality of notches 736, 746, 756, 766, 776 and 786 of a plurality of heat sink elements 730, 740, 750, 760, 770 and 780 have the same lengths. The notches 736, 746, 756, 766, 776 and 786 may be arranged in the same straight line, thereby forming a coupling channel. In some embodiments, the length of each of the heat sink elements 730, 740, 750, 760, 770 and 780 is shorter than the length of each of the first conductive sidewall 121 and the second conductive sidewall 122. Furthermore, a plurality of terminals of the heat sink elements 730, 740, 750, 760, 770 and 780 are neither aligned with the first terminal 121-T of the first conductive sidewall 121 nor aligned with the second terminal 122-T of the second conductive sidewall 122. Other features of the heat dissipation device 700 of FIG. 7 are similar to those of the heat dissipation device 200 of FIG. 2A, FIG. 2B and FIG. 2C. Accordingly, the two embodiments can achieve similar levels of performance.

The invention proposes a novel heat dissipation device for integrating a plurality of heat sink elements with an antenna structure. Generally, the invention has at least the advantages of small size, wide bandwidth, and whole minimized size, and therefore it is suitable for application in a variety of mobile communication devices with limited inner space.

Note that the above element sizes, element shapes, and frequency ranges are not limitations of the invention. An antenna designer can fine-tune these settings or values according to different requirements. It should be understood that the heat dissipation device of the invention is not limited to the configurations of FIGS. 1-7. The invention may merely include any one or more features of any one or more embodiments of FIGS. 1-7. In other words, not all of the features displayed in the figures should be implemented in the heat dissipation device of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat dissipation device with a communication function, comprising:
   a conductive substrate;
   a first conductive sidewall;
   a plurality of heat sink elements, wherein the first conductive sidewall and the heat sink elements are respectively coupled to the conductive substrate; and
   a feeding element, coupled to a signal source, wherein an antenna structure is formed by the feeding element, the conductive substrate, and at least one of the heat sink elements;
   wherein a resonant path of the antenna structure is formed by the at least one of the heat sink elements;
   wherein the feeding element is configured to excite the heat sink elements for radiation.

2. The heat dissipation device as claimed in claim 1, further comprising:
   a second conductive sidewall, wherein the heat sink elements are positioned between the first conductive sidewall and the second conductive sidewall, and wherein the first conductive sidewall, the heat sink elements, and the second conductive sidewall are substantially perpendicular to the conductive substrate.

3. The heat dissipation device as claimed in claim 2, wherein lengths of the heat sink elements are shorter than or equal to lengths of the first conductive sidewall and the second conductive sidewall.

4. The heat dissipation device as claimed in claim 2, wherein terminals of the heat sink elements, a first terminal of the first conductive sidewall, and a second terminal of the second conductive sidewall are aligned with each other and are positioned on a same plane.

5. The heat dissipation device as claimed in claim 1, wherein the first conductive sidewall and the heat sink elements are substantially parallel with each other.

6. The heat dissipation device as claimed in claim 1, wherein the heat sink elements have different lengths, and wherein the first conductive sidewall and the heat sink elements define a plurality of open slots with different lengths.

7. The heat dissipation device as claimed in claim 6, wherein each of the open slots has an open end and a closed end.

8. The heat dissipation device as claimed in claim 6, wherein the open slots are excited to generate a plurality of resonant modes with different frequencies, so that the antenna structure is capable of covering wideband operations.

9. The heat dissipation device as claimed in claim 6, wherein each of the heat sink elements has a notch.

10. The heat dissipation device as claimed in claim 9, wherein a coupling channel is formed by the notches.

11. The heat dissipation device as claimed in claim 10, wherein the antenna structure has a low-frequency resonant path, a high-frequency resonant path, and a coupling resonant path, wherein the low-frequency resonant path mainly consists of relatively long heat sink elements, and wherein the high-frequency resonant path mainly consists of relatively short heat sink elements.

12. The heat dissipation device as claimed in claim 6, wherein two resonant paths of the antenna structure are formed by at least two of the heat sink elements, and wherein the antenna structure covers a first frequency band and a second frequency band.

13. The heat dissipation device as claimed in claim 1, wherein the feeding element directly touches one or more of the heat sink elements.

14. The heat dissipation device as claimed in claim 1, wherein the feeding element is adjacent to but does not directly touch one or more of the heat sink elements.

15. The heat dissipation device as claimed in claim 1, further comprising:
a conductive ramp element, disposed on the conductive substrate, and configured to support the heat sink elements, so that the first conductive sidewall and the heat sink elements define a plurality of open slots with different lengths, wherein the open slots are excited to generate a plurality of resonant modes with different frequencies, so that the antenna structure is capable of covering wideband operations.

16. The heat dissipation device as claimed in claim 15, wherein each of the heat sink elements has a notch, wherein the notches have different lengths, and wherein the notches are substantially arranged in a same straight line.

17. The heat dissipation device as claimed in claim 15, wherein each of the heat sink elements has a notch, wherein the notches have different lengths, and wherein the notches are substantially arranged in different straight lines.

18. The heat dissipation device as claimed in claim 1, wherein each of the heat sink elements substantially has a U-shape.

19. The heat dissipation device as claimed in claim 1, wherein the heat sink elements have same lengths, wherein the first conductive sidewall and the heat sink elements define a plurality of open slots with same lengths, and wherein the open slots are excited to generate a resonant mode with a same frequency.

20. The heat dissipation device as claimed in claim 19, wherein each of the heat sink elements has a notch, wherein the notches have same lengths, wherein the notches are substantially arranged in a same straight line, and wherein a coupling channel is formed by the notches.

21. The heat dissipation device as claimed in claim 20, wherein the antenna structure has a resonant path and a coupling resonant path.

22. The heat dissipation device as claimed in claim 19, wherein each of the heat sink elements has a notch, wherein the notches have different lengths, wherein the notches are substantially arranged in different straight lines, and wherein a coupling channel is formed by the notches.

23. The heat dissipation device as claimed in claim 22, wherein the antenna structure has a resonant path and a coupling resonant path.

24. The heat dissipation device as claimed in claim 1, wherein the heat dissipation device is applicable to an HMD (Head Mount Display) supporting VR (Virtual Reality), AR (Augmented Reality) or MR (Mixed Reality).

25. The heat dissipation device as claimed in claim 1, wherein each of the heat sink elements substantially has a U-shape with a notch, and wherein the notches are configured to increase effective resonant lengths of the heat sink elements.

26. The heat dissipation device as claimed in claim 1, further comprising:
a conductive ramp element, disposed on the conductive substrate, and configured to support the heat sink elements, wherein the heat sink elements have same lengths, wherein the first conductive sidewall and the heat sink elements define a plurality of open slots with different lengths, and wherein the open slots are excited to generate a plurality of resonant modes with different frequencies.

27. The heat dissipation device as claimed in claim 26, wherein each of the heat sink elements has a notch, wherein the notches have same lengths, wherein the notches are substantially arranged in a same straight line, and wherein a coupling channel is formed by the notches.

28. The heat dissipation device as claimed in claim 26, wherein each of the heat sink elements has a notch, wherein the notches have different lengths, wherein the notches are substantially arranged in different straight lines, and wherein a coupling channel is formed by the notches.

29. The heat dissipation device as claimed in claim 1, further comprising:
a conductive ramp element, disposed on the conductive substrate, and configured to support the heat sink elements, wherein the heat sink elements have different lengths, wherein the first conductive sidewall and the heat sink elements define a plurality of open slots with different lengths, wherein the open slots are excited to generate a plurality of resonant modes with different frequencies, and wherein the conductive ramp element makes terminals of the heat sink elements aligned with each other.

30. The heat dissipation device as claimed in claim 29, wherein each of the heat sink elements has a notch, wherein the notches have same lengths, wherein the notches are substantially arranged in a same straight line, and wherein a coupling channel is formed by the notches.

31. The heat dissipation device as claimed in claim 29, wherein each of the heat sink elements has a notch, wherein the notches have different lengths, wherein the notches are substantially arranged in different straight lines, and wherein a coupling channel is formed by the notches.

32. The heat dissipation device as claimed in claim 29, wherein the antenna structure has a low-frequency resonant path and a high-frequency resonant path, wherein the low-frequency resonant path mainly consists of relatively long heat sink elements, and wherein the high-frequency resonant path mainly consists of relatively short heat sink elements.

* * * * *